United States Patent
Liehr

(12) 
(10) Patent No.: US 6,194,835 B1
(45) Date of Patent: Feb. 27, 2001

(54) DEVICE FOR PRODUCING PLASMA

(75) Inventor: Michael Liehr, Feldatal (DE)

(73) Assignee: Leybold Systems GmbH, Hanau (DE)

( * ) Notice: Subject to any disclaimer, the term of this patent is extended or adjusted under 35 U.S.C. 154(b) by 0 days.

(21) Appl. No.: 09/230,567

(22) PCT Filed: May 25, 1998

(86) PCT No.: PCT/EP98/03062

§ 371 Date: Jan. 6, 2000

§ 102(e) Date: Jan. 6, 2000

(87) PCT Pub. No.: WO98/54748

PCT Pub. Date: Dec. 3, 1998

(30) Foreign Application Priority Data

May 28, 1997 (DE) ............................................. 197 22 272

(51) Int. Cl.⁷ .............................. H01J 7/24; H05B 31/26
(52) U.S. Cl. ................................ 315/111.21; 315/111.51; 118/723 AN; 118/723 I; 118/723 IR; 156/345
(58) Field of Search ........................ 315/111.21, 111.51; 118/723 AN, 723 I, 723 IR; 156/345

(56) References Cited

U.S. PATENT DOCUMENTS 4,515,107 * 5/1985 Fournier et al. .............. 118/723 AN

FOREIGN PATENT DOCUMENTS 4136297  5/1993 (DE).
1950320  7/1996 (DE).

* cited by examiner

Primary Examiner—Michael B Shingleton
(74) Attorney, Agent, or Firm—Smith, Gambrell & Russell, LLP

(57) ABSTRACT

A device for producing plasma includes an isolating pipe formed of an isolating material, a rod-shaped conductor positioned inside of the pipe, the rod-shaped conductor having an inner diameter that is smaller than the diameter of the of the isolating pipe, and an inner alternating electromagnetic field source connected to a first end of the conductor. The device also includes a conductive pipe positioned inside of the isolating pipe and concentrically around the conductor, the conductive pipe being formed so as to partially enclose the conductor, and an outer alternating electromagnetic field source connected to a first end of the conductive pipe.

25 Claims, 4 Drawing Sheets

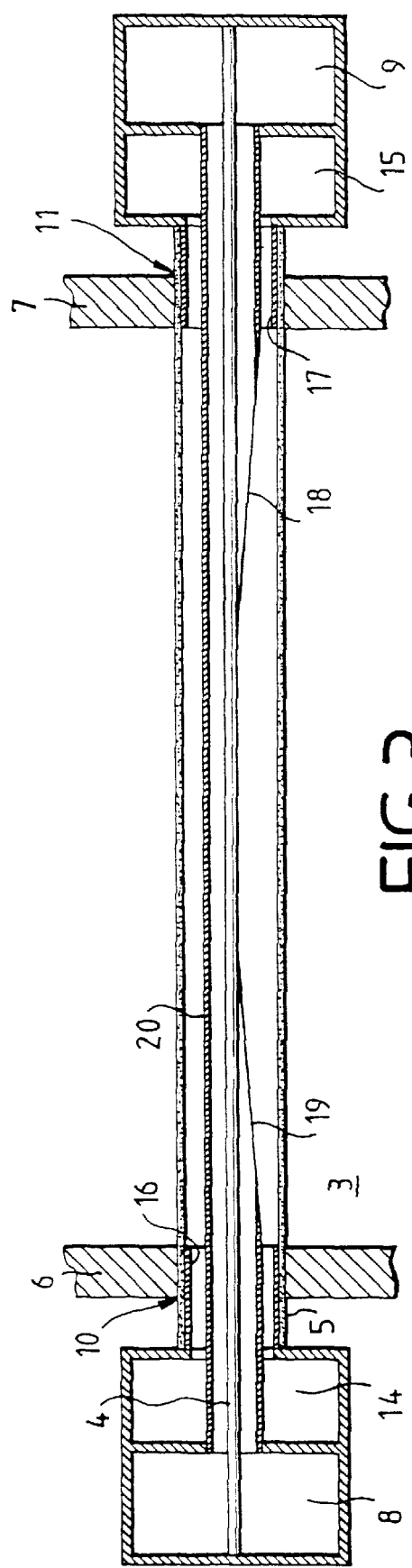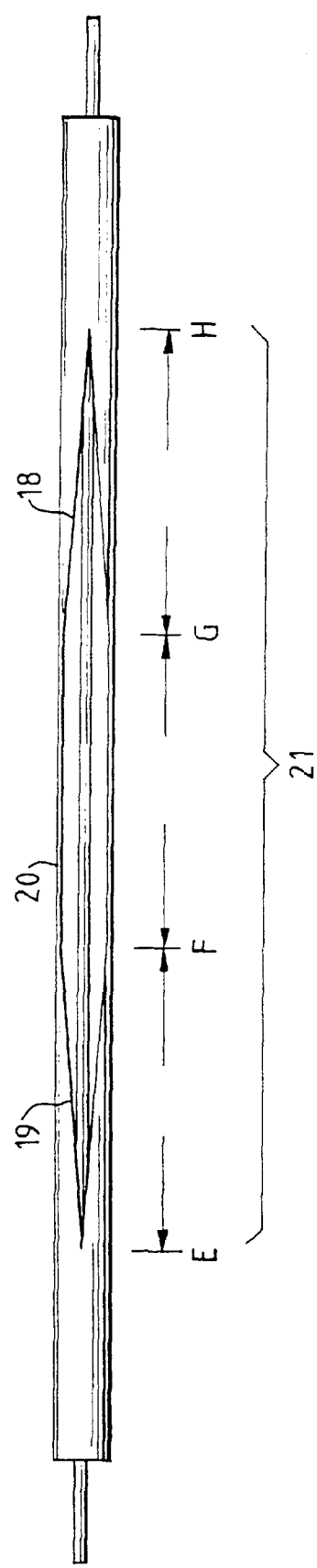
FIG.2
FIG.3

DEVICE FOR PRODUCING PLASMA

BACKGROUND OF THE INVENTION

1. Field of the Invention

The invention concerns a device for producing plasma in a vacuum chamber with the help of alternating electromagnetic fields. According to the invention, a rod-shaped conductor is positioned inside of a pipe made of an isolating material and having an inner diameter larger than the diameter of the conductor. The isolating pipe is positioned inside of a vacuum chamber, whereby both ends of the isolating pipe are held in the walls of the vacuum chamber, and the outer surface of the pipe forms a seal between the chamber walls. Both ends of the conductor are then connected to a source for producing the alternating electromagnetic field.

2. Discussion of the Prior Art

With a known device for producing plasma (DE 195 03 205), it is possible to produce plasma for surface treatments and coating techniques within a limited operating range (i.e., with limited operating parameters, such as process area, gas pressure, and microwave output). The known device essentially consists of a cylindrical glass pipe installed in a vacuum chamber and a metallic-conducting pipe located within the glass pipe, whereby atmospheric pressure exists in the inner space of the glass pipe. Microwave output is initiated on both sides of the pipe through the walls of the vacuum process chamber by two power supplies and two metallic coaxial transmission lines, which consist of an inner conductor and an outer conductor. The absent outer conductor of the coaxial transmission line inside the vacuum process chamber is replaced by a plasma discharge, which is ignited and maintained by the microwave output under sufficient igniting conditions (gas pressure). The microwave output can be radiated from both the metallic coaxial transmission lines and the glass pipe in the vacuum process chamber. The plasma surrounds the cylindrically shaped glass pipe from the outside and forms, together with the inner conductor, a coaxial transmission line with a high attenuation coefficient. With a steady microwave output fed on both sides of the pipes, the gas pressure of the vacuum process chamber can be adjusted in such a way that the plasma apparently burns evenly along the device where the outside conductor of the coaxial transmission line is absent.

When the gas pressure in the vacuum process chamber is raised while a preset microwave output is applied, however, experience tells us that the uniformity of the plasma along the device is lost. The plasma at about half the distance between the power supply points of the device becomes optically weaker and can be completely extinguished beyond a certain pressure. When the pressure is raised further, the plasma line "tears apart" and the two existing plasma sections withdraw in the direction of the power supplies. Especially with long devices (e.g., 1 m or more) this effect leads to irregular plasmas and irregular vacuum processes resulting from it. The plasma sections display high luminosity at the ends near the walls and are weaker towards the middle. This can be attributed to an intrinsic behavior of coaxial transmission lines for which it obviously plays no role whether the outer conductor consists of metal or of electrically conductive plasma.

It is known that the attenuation $\alpha_c$ of the transverse electromagnetic waves is limited per unit of length of the coaxial transmission line by the electrical conductivity of the inner and outer conductors, and that this relationship can be formulated as follows:

$$\alpha_c = 13.6 \cdot \frac{\delta_s \cdot \sqrt{\epsilon_R} \cdot \{1 + (b/a)\}}{\lambda_0 \cdot b \cdot \ln(b/a)} \text{ dB/unit of length.}$$

The parameters a and b indicate the outer diameter of the inner conductor and inner diameter of the outer conductor of a coaxial transmission line;

$\delta_S$ indicates the penetration depth (skin effect) of the microwaves in the conductive surfaces;

$\lambda_0$ is the free-space wavelength of the microwaves used, and $\epsilon_R$ indicates the relative dielectric constants of the dielectrics of the coaxial transmission line (=1 for air).

As one can infer from the formula, the attenuation of the microwaves does not in any way depend on the position along the coaxial transmission line. Because the dielectric filler of the coaxial transmission line consists of air and $\epsilon_R$ is constant over the length of the device, the magnitude of the attenuation depends only on the penetration depth of the microwaves in the conducting surfaces. When there is a constant attenuation per unit of length, this means that the net microwave output emitted per unit of length on the plasma decreases along the device toward the middle. Because the outside conductor consists of plasma, its conductivity cannot be determined exactly. Of course the conductivity of the outside conductor depends on the plasma density and this in turn is, to a limited extent, a function of the microwave power density in the discharge area. It is presumably several magnitudes higher than in the case of metallic surfaces (~50 μm) and not constant over the length of the device.

Furthermore, it has been shown that the known device is rarely capable of maintaining a plasma discharge at pressures lower than $8 \times 10^{-2}$ mbar. To raise the flexibility of the device it would be desirable to guarantee the operating conditions for a plasma discharge without the support of the magnetic field at even lower pressures.

The present invention is based on the technical problem of improving the disadvantages of the known device.

SUMMARY OF THE INVENTION

The problems of the prior art are solved according to the invention by enclosing the rod-shaped conductor, at intervals, by at least one pipe section made of an electrically conductive material. One embodiment of the invention employs two conductive pipe sections, each section extending from the area of the wall bushing in the direction toward the center part of the conductive rod, whereby the two pipe segments are arranged concentric to the isolation pipe and each is connected to a second source for producing an electromagnetic alternating field.

In a preferred working model, the rod-shaped conductor is enclosed, at intervals, that is, the rod-shaped conductor is partially enclosed, by a pipe made of an electrically conductive material. Both ends of the conductive pipe are connected to a second, or outer, source for producing an electromagnetic alternating field, and the center part of the pipe is provided with a recess such as, for example an elongated, rhombus-shaped longitudinal slot.

BRIEF DESCRIPTION OF THE DRAWINGS

The invention allows for very different possibilities for design; two of which are represented schematically in the drawings attached. In the drawings the following figures are included:

FIG. 2 is an alternative working model with a conductive pipe enclosing the rod-shaped conductor along its entire length, whereby the conductive pipe is provided with a longitudinally shaped recess over a considerable part its length;

FIG. 3 shows the pipe according to the embodiment of the invention illustrated in FIG. 2;

DETAILED DESCRIPTION OF THE INVENTION

Figure 1:
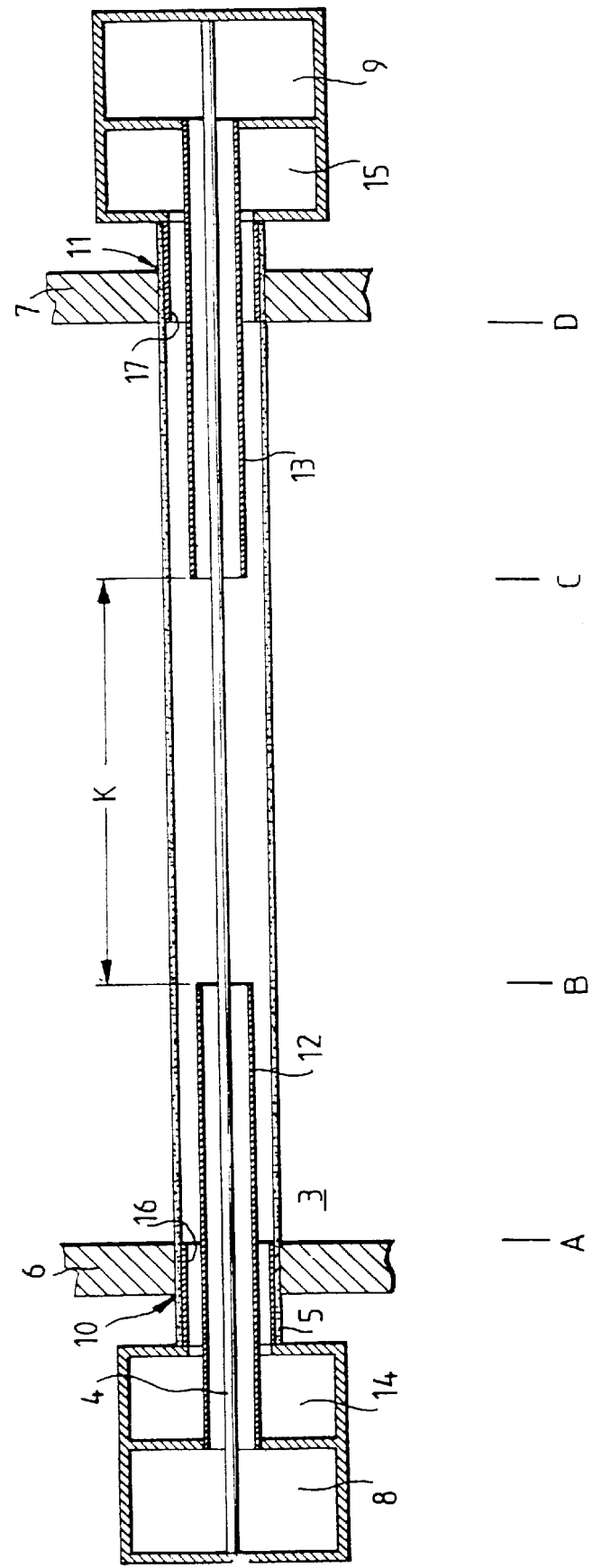
FIG. 1 shows a device for producing plasma in a longitudinal section, the device having conductive pipe sections in the area of both ends of a rod-shaped conductor.

The device according to FIG. 1 includes the isolating pipe 5 (a glass pipe), which is guided through the wall parts 6, 7 of the vacuum chamber 3, and metal collars 10, 11 which prevents the formation of plasma in the area of the wall bushings 10, 11. The rod-shaped conductor 4 is positioned coaxially within the isolating pipe, and the first, or inner, sources 8, 9 for producing an alternating electromagnetic field are positioned on both ends of the conductor 4. The metallic pipe segments 12, 13 enclose conductor 4, extending in the longitudinal direction of the conductor. The second, or outer, sources 14, 15 for producing an alternating electromagnetic field are connected to the pipe sections 12, 13, respectively, and to the metal collars 16, 17, respectively.

An alternate embodiment of the invention shown in FIG. 2 can be distinguished from the one previously described by the fact that the rod-shaped conductor 4 is partially enclosed by a single pipe 20 made of electrically conductive material, whereby each end of the pipe 20 is connected to an outer source 14 or 15, and the middle part of the pipe 20 is provided with a longitudinally shaped recess 21. This alternate embodiment will be discussed in greater detail below.

Referring back to FIG. 1, the device shown in FIG. 1 is equipped with a total of four coaxial microwave power supplies. That is, the additional metallic conducting pipes 12 and 13, together with the inner conductor 4 and outer conductors 16, 17, yield a total of four coaxial, concentric microwave power supplies, namely: 16, 12 in area A; 12, 4 in area B; 13, 4 in area C; and 17, 13 in area D. Instead of four concentric, coaxial microwave power supplies six, eight, or more microwave power supplies (depending on technical feasibility) can be installed in the vacuum process chamber for longer plasma sources and/or for use with higher gas pressures, whereby the intervals (e.g., A-B or B-C) can be varied relative to each other so that an even plasma distribution is attained. For every two concentric coaxial transmission lines, only three metallic conductive pipes are needed. The outer conductor of an inner coaxial transmission line is simultaneously the inner conductor of an outer coaxial transmission line enclosing the inner coaxial transmission line.

In the device according to FIG. 1, the change-overs from the metallic coaxial transmission line to the "plasma line" are abrupt—i.e., the front surface planes of the metallic outer conductors (e.g., 16) are perpendicular to the center axis. To counteract the strong attenuation of the microwave output on the power supply points (which corresponds to the power output of the plasma), the outer conductor can be modified as shown in FIG. 2. That is, the outer conductor 20 can be modified in such a way that it is constantly increasingly interrupted, as is shown in the areas E–F and G–H. With this arrangement, the metallic coaxial transmission line is increasingly replaced by a plasma line toward the center. While this configuration has the disadvantage that the plasma does not burn radially symmetric around the glass pipe 5, this disadvantage is insignificant for most applications. It should be noted that the change-over from a metallic conductor to a plasma conductor can also take another shape, e.g., through coaxial slots with an increasing width. It is only necessary that the change-over not be abrupt, but rather continuously increasing, and that no wave reflections occur.

Figure 4:
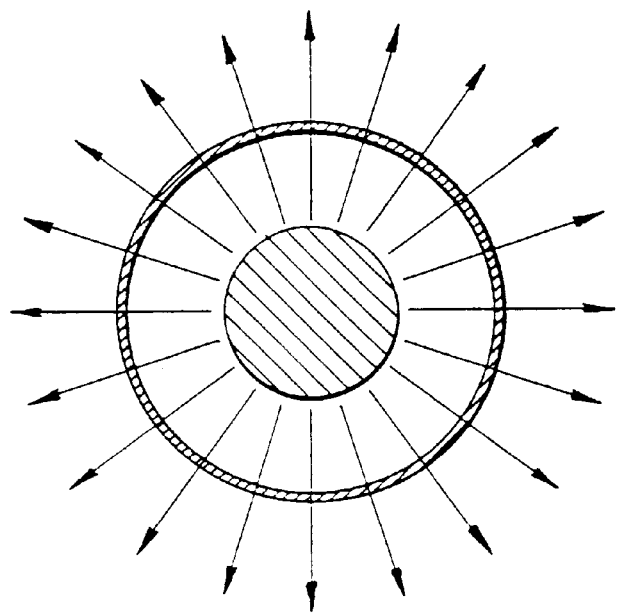
FIGS. 4 and 5 show two variations of the rod-shaped conductor according to the invention, each variation being represented in cross section.
Figure 5:
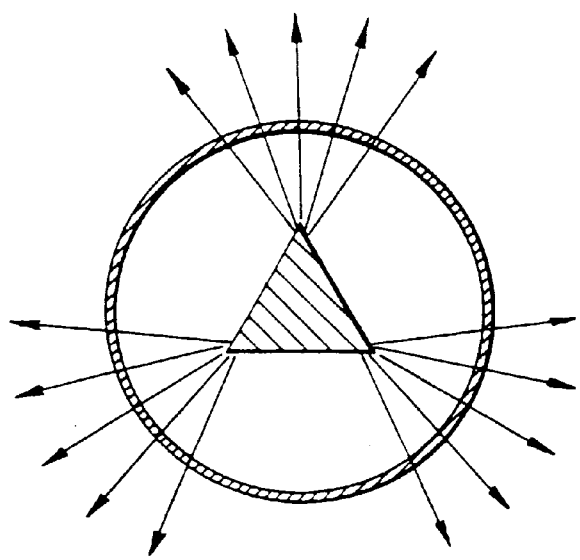

To improve the plasma conditions during high and low gas pressures in the discharge volumes, it is advantageous to raise the field intensity for a preset microwave output. This is one advantage of plasma sources with resonant structures (resonators) over traveling-wave structures. (The known device disclosed in DE 195 03 205 is a traveling-wave structure and is operated with purely transverse electromagnetic (TEM) waves.) For embodiments of the invention, a higher field intensity can also be obtained by changing the cross section of the metallic inner conductor 4 from the cylindrical shape (shown in FIG. 4) to an edged shape (shown in FIG. 5). The strict radial symmetry of the electrical field portion of the alternating electromagnetic field in the case of the cylindrical inner conductor is broken and a concentration of the electrical field lines (indicated by the broken arrows in FIGS. 4 and 5) occurs at the edges of the conductor.

Figure 6:
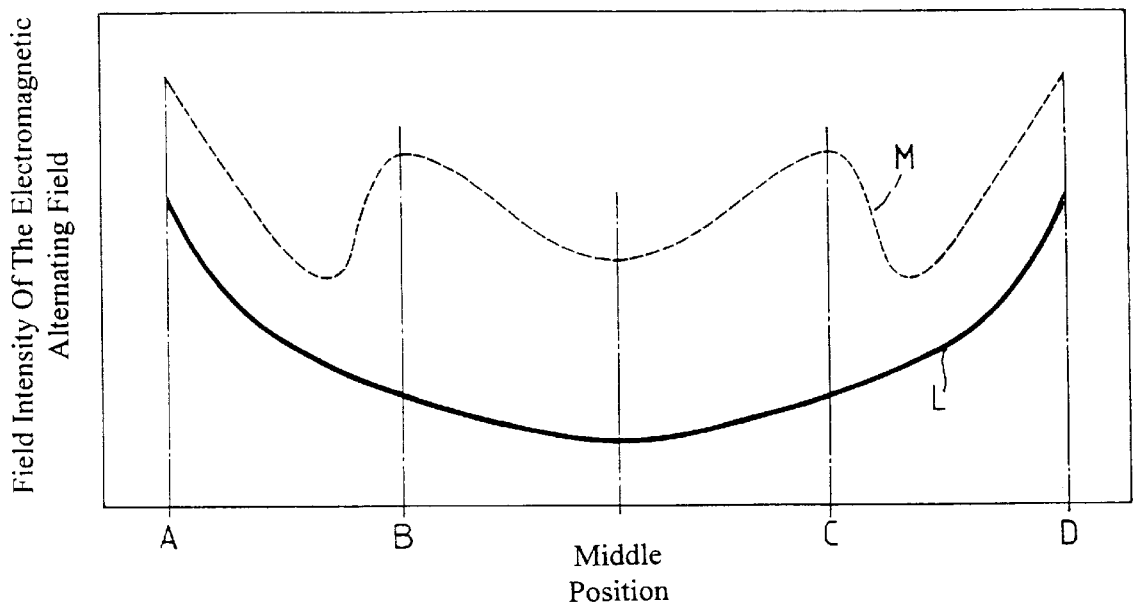
FIGS. 6 and 7 are diagrammatic representations of the field intensity of the electromagnetic field for the devices shown in FIGS. 1 and 2, respectively.

The embodiment of the invention according to FIG. 1 produces a more even distribution of the field intensity of the electric field portion of the electromagnetic alternating field of the microwaves over the entire length of the device, as is shown in FIG. 6. With only two power supply points A, D, distribution results in accordance with curve L are obtained. With four power supply points, a distribution in accordance with curve M can be expected. (It should be noted that the curves in the diagram have absolutely no relation to each other; only the shape of the curves is relevant.) In addition, the invention offers an improvement in that it allows the microwave output to be fed into a single device by using a larger number of microwave generators than two. This is, for example, very important for plasma-chemical processes, which take place with process pressures of 50 mbar and higher (e.g., diamond precipitation).

Figure 7:
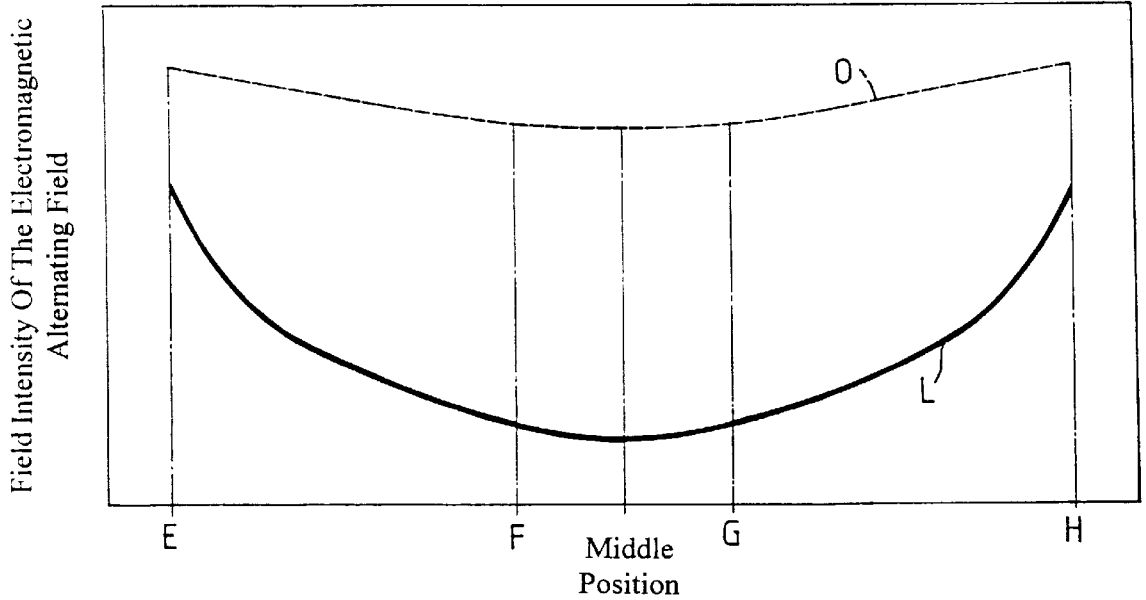

The embodiment of the invention illustrated in FIG. 2 produces a more even distribution of the field intensity of the electric field portion of the electromagnetic alternating field of the microwaves over the entire length of the device, as is indicated in FIG. 7. With the continuously increasing change-over between points E–F and G–H, distribution results in accordance with curve O are produced. Curve O represents a nearly ideal distribution for linear plasma sources. This improvement, however, works like the original device with only two power supply points.

Should high power densities occur with the microwaves along the device, then the properties of the different embodiments should be combined in accordance with FIGS. 1 and 2. With the corresponding dimensions of the device, absolutely homogenous plasma densities can be attained over long stretches (e.g., 3 m) in this way.

The form of the pipe 20 with the elongated, rhombus-shaped recess 21 shown in FIG. 3 produces an increase in the electric field portion of the electromagnetic alternating field near the edges (compared to a cylindrical, metallic inner conductor with an unchanged microwave output) and thus an improvement in the conditions for plasma ignition and burning when the gas pressure in the discharge zone is low or high.

What is claimed is:

1. A device for producing plasma, comprising:
   an isolating pipe formed of an isolating material;
   a rod-shaped conductor positioned inside of the pipe, the inner diameter of the isolating pipe being larger than a diameter of the conductor;
   an inner alternating electromagnetic field source connected to a first end of the conductor;
   a conductive pipe formed of a conductive material, the conductive pipe being positioned inside of the isolating pipe and concentrically around the conductor and being formed so as to partially enclose the conductor; and
   an outer alternating electromagnetic field source connected to a first end of the conductive pipe.

2. A device for producing plasma as recited in claim 1, further including a vacuum chamber having a first wall and a second wall, wherein the isolating pipe extends from the first wall to the second wall to form a seal between an inside of the isolating pipe and an interior of the vacuum chamber.

3. A device for producing plasma as recited in claim 2, wherein the inner alternating electromagnetic field source and the outer alternating electromagnetic field source are located outside of the first wall of the vacuum chamber.

4. A device for producing plasma as recited in claim 3, further including a metal collar extending from the outer alternating electromagnetic field source to the first wall of the vacuum chamber.

5. A device for producing plasma as recited in claim 1, further including
   a second inner alternating electromagnetic field source connected to a second end of the conductor opposite the first end of the conductor; and
   a second outer alternating electromagnetic field source connected to a second end of the conductive pipe opposite the first end of the conductive pipe.

6. A device for producing plasma as recited in claim 5, further including a vacuum chamber having a first wall and a second wall, wherein the isolating pipe extends from the first wall to the second wall to form a seal between an inside of the isolating pipe and an interior of the vacuum chamber.

7. A device for producing plasma as recited in claim 6, wherein the first inner alternating electromagnetic field source and the first outer alternating electromagnetic field source are located outside of the first wall of the vacuum chamber, and the second inner alternating electromagnetic field source and the second outer alternating electromagnetic field source are located outside of the second wall of the vacuum chamber.

8. A device for producing plasma as recited in claim 7, further including
   a first metal collar extending from the first outer alternating electromagnetic field source to the first wall of the vacuum chamber, and
   a second metal collar extending from the second outer alternating electromagnetic field source to the second wall of the vacuum chamber.

9. A device for producing plasma as recited in claim 1, wherein the conductive pipe defines an opening in a center part thereof, whereby the conductor is exposed at the opening.

10. A device for producing plasma as recited in claim 9, wherein the opening is an elongated, rhombus-shaped opening.

11. A device for producing plasma as recited in claim 9, further including a vacuum chamber having a first wall and a second wall, wherein the isolating pipe extends from the first wall to the second wall to form a seal between an inside of the isolating pipe and an interior of the vacuum chamber.

12. A device for producing plasma as recited in claim 11, wherein the inner alternating electromagnetic field source and the outer alternating electromagnetic field source are located outside of the first wall of the vacuum chamber.

13. A device for producing plasma as recited in claim 12, further including a metal collar extending from the outer alternating electromagnetic field source to the first wall of the vacuum chamber.

14. A device for producing plasma as recited in claim 9, further including
   a second inner alternating electromagnetic field source connected to a second end of the conductor opposite the first end of the conductor; and
   a second outer alternating electromagnetic field source connected to a second end of the conductive pipe opposite the first end of the conductive pipe.

15. A device for producing plasma as recited in claim 14, further including a vacuum chamber having a first wall and a second wall, wherein the isolating pipe extends from the first wall to the second wall to form a seal between an inside of the isolating pipe and an interior of the vacuum chamber.

16. A device for producing plasma as recited in claim 15, wherein the first inner alternating electromagnetic field source and the first outer alternating electromagnetic field source are located outside of the first wall of the vacuum chamber, and the second inner alternating electromagnetic field source and the second outer alternating electromagnetic field source are located outside of the second wall of the vacuum chamber.

17. A device for producing plasma as recited in claim 16, further including
   a first metal collar extending from the first outer alternating electromagnetic field source to the first wall of the vacuum chamber, and
   a second metal collar extending from the second outer alternating electromagnetic field source to the second wall of the vacuum chamber.

18. A device for producing plasma as recited in claim 1, further including a second conductive pipe formed of a conductive material, the second conductive pipe being positioned inside of the isolating pipe and concentrically around the conductor and being formed so as to partially enclose the conductor, wherein the first conductive pipe extends from the first end of the conductor toward a center of the conductor, and the second conductive pipe extends from a second end of the conductor, opposite the first end of the conductor, toward the center of the conductor, whereby the conductor is exposed between the two conductive pipes.

19. A device for producing plasma as recited in claim 18, further including a vacuum chamber having a first wall and a second wall, wherein the isolating pipe extends from the first wall to the second wall to form a seal between an inside of the isolating pipe and an interior of the vacuum chamber.

20. A device for producing plasma as recited in claim 19, wherein the inner alternating electromagnetic field source and the outer alternating electromagnetic field source are located outside of the first wall of the vacuum chamber.

21. A device for producing plasma as recited in claim 20, further including a metal collar extending from the outer alternating electromagnetic field source to the first wall of the vacuum chamber.

22. A device for producing plasma as recited in claim 18, further including a second inner alternating electromagnetic field source connected to the second end of the conductor; and a second outer alternating electromagnetic field source connected to an end of the second conductive pipe opposite the first conductive pipe.

23. A device for producing plasma as recited in claim 22, further including a vacuum chamber having a first wall and a second wall, wherein the isolating pipe extends from the first wall to the second wall to form a seal between an inside of the isolating pipe and an interior of the vacuum chamber.

24. A device for producing plasma as recited in claim 23, wherein the first inner alternating electromagnetic field source and the first outer alternating electromagnetic field source are located outside of the first wall of the vacuum chamber, and the second inner alternating electromagnetic field source and the second outer alternating electromagnetic field source are located outside of the second wall of the vacuum chamber.

25. A device for producing plasma as recited in claim 24, further including a first metal collar extending from the first outer alternating electromagnetic field source to the first wall of the vacuum chamber, and a second metal collar extending from the second outer alternating electromagnetic field source to the second wall of the vacuum chamber.

* * * * *